(12) United States Patent
Van De Vijver et al.

(10) Patent No.: US 10,310,394 B2
(45) Date of Patent: Jun. 4, 2019

(54) LITHOGRAPHIC APPARATUS, A PROJECTION SYSTEM AND A DEVICE MANUFACTURING METHOD

(71) Applicant: ASML NETHERLANDS B.V., Veldhoven (NL)

(72) Inventors: Yuri Johannes Gabriel Van De Vijver, Best (NL); Johannes Hubertus Josephina Moors, Helmond (NL); Wendelin Johanna Maria Versteeg, Eindhoven (NL); Peter Gerardus Jonkers, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 56 days.

(21) Appl. No.: 15/289,118

(22) Filed: Oct. 7, 2016

(65) Prior Publication Data

US 2017/0097579 A1    Apr. 6, 2017

Related U.S. Application Data

(63) Continuation of application No. 12/745,344, filed as application No. PCT/NL2008/050731 on Nov. 18, 2008.

(60) Provisional application No. 61/004,772, filed on Nov. 30, 2007.

(51) Int. Cl.
  *G03F 7/20*    (2006.01)

(52) U.S. Cl.
  CPC ...... *G03F 7/70933* (2013.01); *G03F 7/70841* (2013.01); *G03F 7/70866* (2013.01); *G03F 7/70883* (2013.01); *G03F 7/70916* (2013.01)

(58) Field of Classification Search
  CPC .................................................. G03F 7/70933
  See application file for complete search history.

(56) References Cited

U.S. PATENT DOCUMENTS

| | | | |
|---|---|---|---|
| 4,690,528 A | 9/1987 | Tanimoto et al. | |
| 6,542,220 B1 | 4/2003 | Schrijver et al. | |
| 6,842,221 B1 * | 1/2005 | Shiraishi | G03F 7/70741 355/30 |
| 7,030,959 B2 | 4/2006 | Sogard | |
| 7,476,491 B2 | 1/2009 | Van Der Net et al. | |
| 7,667,820 B2 | 2/2010 | Kempen | |

(Continued)

FOREIGN PATENT DOCUMENTS

| | | |
|---|---|---|
| CN | 1275099 | 9/2006 |
| CN | 1892424 | 1/2007 |

(Continued)

OTHER PUBLICATIONS

Japanese Office Action dated Dec. 26, 2012 in corresponding Japanese Patent Application No. 2010-535902.

(Continued)

*Primary Examiner* — Steven Whitesell Gordon
(74) *Attorney, Agent, or Firm* — Pillsbury Winthrop Shaw Pittman LLP

(57) ABSTRACT

A lithographic apparatus is disclosed that includes a projection system configured to project a patterned radiation beam onto a target portion of a substrate, a vacuum chamber through which the patterned beam of radiation is projected during use, and a purge system configured to provide a purge gas flow in the chamber.

14 Claims, 4 Drawing Sheets

(56) References Cited

U.S. PATENT DOCUMENTS

| | | |
|---|---|---|
| 2001/0015795 A1 | 8/2001 | Nishi |
| 2001/0026354 A1 | 10/2001 | Aoki |
| 2002/0051123 A1 | 2/2002 | Banine et al. |
| 2003/0016780 A1 | 1/2003 | Matsuo et al. |
| 2003/0095240 A1 | 5/2003 | Van Schaik et al. |
| 2004/0051984 A1 | 3/2004 | Oshino et al. |
| 2005/0069433 A1* | 3/2005 | Hayashi ............ G03F 7/70808 417/423.4 |
| 2005/0110966 A1* | 5/2005 | Hasegawa .......... G03F 7/70891 355/30 |
| 2006/0017895 A1* | 1/2006 | Sogard .............. G03F 7/70875 355/30 |
| 2006/0055900 A1 | 3/2006 | Van Der Net et al. |
| 2006/0131682 A1 | 6/2006 | Moors et al. |
| 2006/0268246 A1* | 11/2006 | Jacobs ............... G03F 7/70908 355/30 |
| 2007/0030466 A1 | 2/2007 | Shuichi |
| 2007/0079525 A1 | 4/2007 | Sogard |
| 2007/0097342 A1 | 5/2007 | Gomei et al. |
| 2007/0125964 A1* | 6/2007 | Van Herpen ........... B82Y 10/00 250/492.2 |
| 2007/0166215 A1 | 7/2007 | Kempen |
| 2007/0236673 A1* | 10/2007 | Namba .............. G03F 7/70891 355/30 |
| 2008/0030705 A1* | 2/2008 | Namba ................ G03B 27/42 355/53 |

FOREIGN PATENT DOCUMENTS

| | | |
|---|---|---|
| CN | 1959541 | 5/2007 |
| EP | 1460479 A2 | 9/2004 |
| EP | 1708032 A2 | 4/2006 |
| JP | 2003-522400 | 7/2003 |
| JP | 2004-186614 | 7/2004 |
| JP | 2006-093724 | 4/2006 |
| JP | 2006-279051 | 10/2006 |
| JP | 2007-201460 | 8/2007 |
| JP | 2007-281142 | 10/2007 |
| KR | 1020070100127 A | 10/2007 |
| WO | WO99/57607 | 11/1999 |
| WO | WO01/79936 A1 | 10/2001 |

OTHER PUBLICATIONS

International Search Report of PCT/NL2008/050700.
Chinese Office Action dated Nov. 21, 2013 in corresponding Chinese Patent Application No. 201210005732.0.
Written Opinion, issued by the International Bureau of WIPO dated Jun. 10, 2010, in Priority International Application No. PCT/NL2008/050731.

\* cited by examiner

LITHOGRAPHIC APPARATUS, A PROJECTION SYSTEM AND A DEVICE MANUFACTURING METHOD

CROSS-REFERENCE TO RELATED APPLICATIONS

This is a continuation of U.S. patent application Ser. No. 12/745,344, filed May 28, 2010, which is a U.S. National Stage of PCT/N L2008/050731, filed Nov. 18, 2008, which in turn claims priority to U.S. Provisional Application No. 61/004,772, filed Nov. 30, 2007, the entire contents of both applications are incorporated herein by reference.

FIELD

The present invention relates to a lithographic apparatus, a projection system and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer), Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a known lithography system, the projection system comprises a vacuum chamber wherein the patterned beam of radiation is projected. As such, the projected beam traverses at least a region of the vacuum chamber. In the vacuum chamber, contamination with particles, such as carbon hydroxyl particles originating from substrate structures, might damage an optical element, such as a mirror. Further, the contamination particles might influence the optical transmittance of the projected beam. Especially, an extreme ultraviolet (EUV) lithography system might suffer from such gas contamination.

In U.S. patent application publication no. U.S. Pat. No. 6,714,279, a vacuum chamber is provided with an inert gas supply. By supplying an inert gas in the vacuum chamber contamination of optical components may be suppressed.

SUMMARY

It is desirable, for example, to realize a lithographic apparatus wherein the occurrence of contamination particles in the vacuum chamber is further suppressed.

According to an aspect of the invention, there is provided a lithographic apparatus comprising an illumination system configured to condition a radiation beam, a support constructed to support a patterning device, the patterning device being capable of imparting the radiation beam with a pattern in its cross-section to form a patterned radiation beam, a substrate table constructed to hold a substrate, a projection system configured to project the patterned radiation beam onto a target portion of the substrate, a vacuum chamber through which the patterned beam of radiation is projected during use, and a purge system configured to provide a purge gas flow in the chamber.

According to an aspect of the invention, there is provided a projection system configured to project a patterned radiation beam onto a target portion of a substrate in a lithographic apparatus, wherein the projection system comprises a vacuum chamber wherein the patterned beam of radiation is projected during use and wherein the projection system further comprises a purge system for providing a purge gas flow in the chamber.

According to an aspect of the invention, there is further provided a device manufacturing method comprising projecting a patterned beam of radiation onto a substrate, wherein a purge gas flow is applied in a vacuum chamber through which the patterned beam of radiation is projected.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
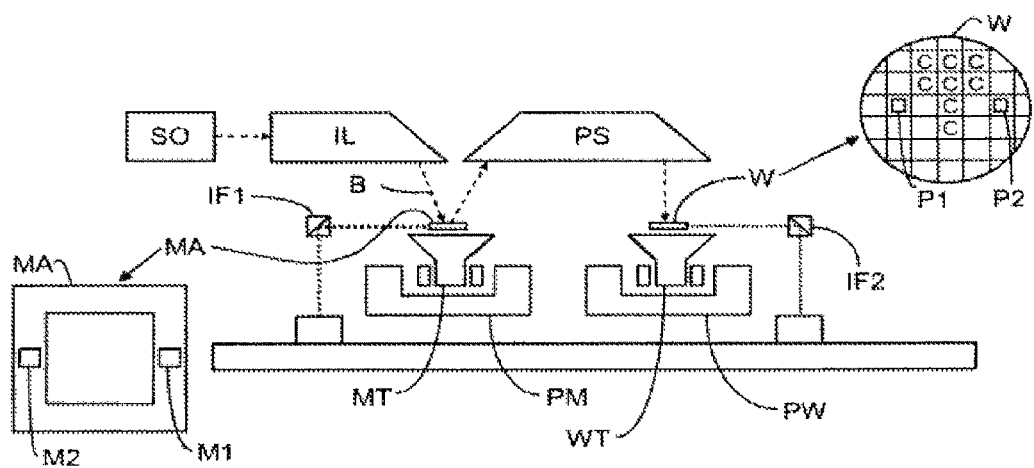
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or visible light radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more patterning device support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
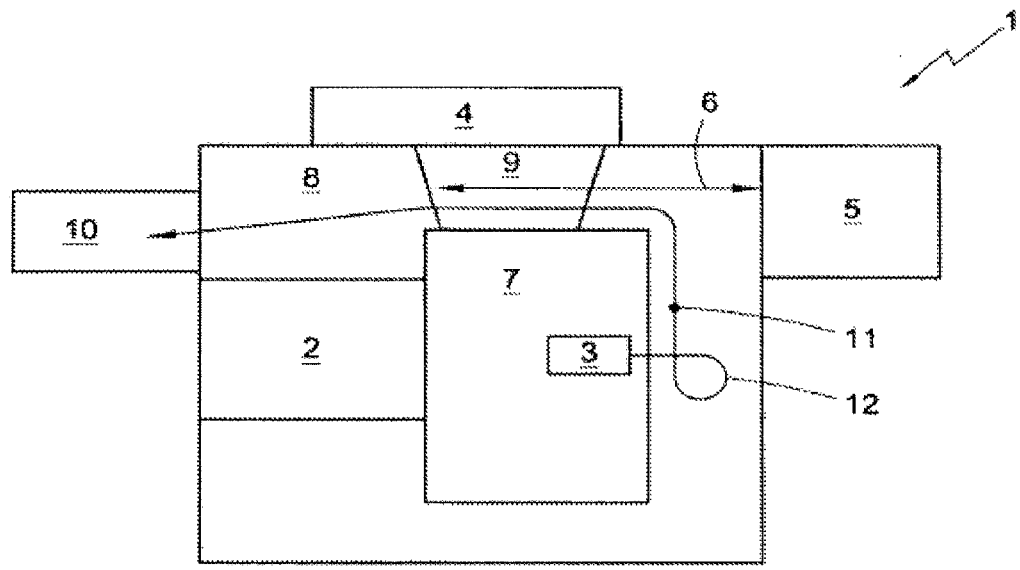
FIG. 2 depicts a schematic view of a lithographic apparatus.

FIG. 2 depicts schematically a lithographic apparatus 1. The lithographic apparatus comprises an illumination system 2, e.g. comprising an EUV source, that is configured to condition a radiation beam. Further, the apparatus 1 comprises a support (not shown for clarity) configured to hold a patterning device 3, the patterning device capable of imparting the radiation beam with a pattern in its cross-section to form a patterned radiation beam. The apparatus 1 also comprises a substrate table 4 configured to hold a substrate. The substrate can be moved by a substrate handler 5 so as to move the substrate for further processing along a substrate exchange path 6. The lithographic apparatus 1 further comprises a projection system 7 configured to project the patterned beam of radiation and a vacuum chamber 8 wherein the patterned beam of radiation is projected. During operation of the lithographic apparatus 1, the projected patterned beam 9 traverses a region of the vacuum chamber 8 before reaching the substrate that is held by the substrate table 4. The apparatus 1 also comprises a pump 10 configured to receive contamination particles that are present in the vacuum chamber 8. In FIG. 1, an example contamination particle 11 is schematically shown. The contamination particle 11 moves in a quasi arbitrary path 12 in the vacuum chamber 8 before being received in the pump 10.

Figure 3:
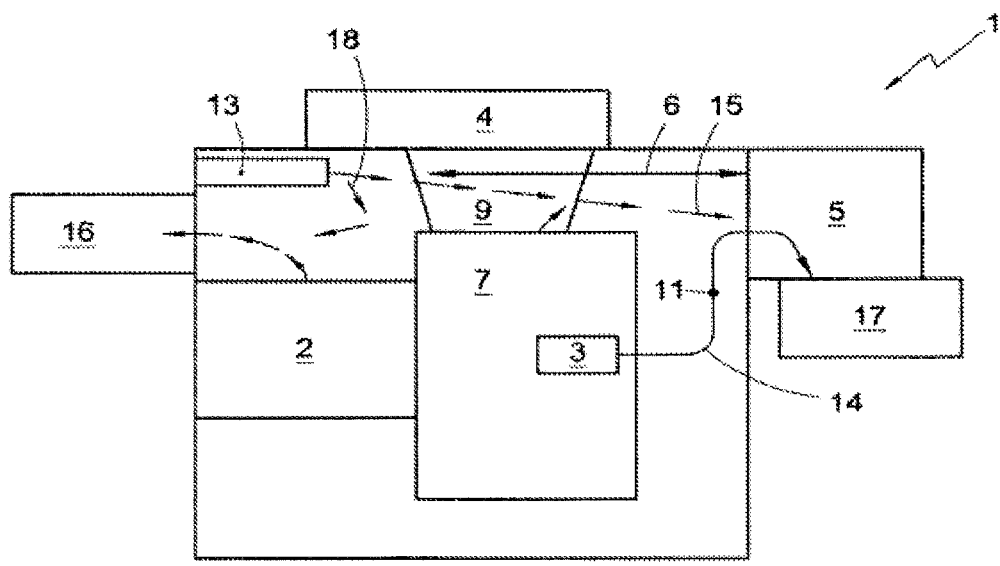
FIG. 3 depicts a schematic view of a lithographic apparatus according to an embodiment of the invention.

FIG. 3 shows a schematic view of a lithographic apparatus 1 according to an embodiment of the invention. Similar to the apparatus 1 depicted in FIG. 2, the lithographic apparatus 1 according to an embodiment of the invention comprises an illumination system 2, a support configured to hold a patterning device 3, a substrate table 4, a projection system 7 and a vacuum chamber 8. Further, the projection system 7 of the apparatus 1 shown in FIG. 2 is provided with a purge system configured to provide a purge gas flow in the vacuum chamber 8. By applying a purge gas flow in the vacuum chamber 8 wherein the patterned beam of radiation is projected, the number of contamination particles in the region where the projected beam 9 traverses the chamber 8 may be reduced, thus helping to improve the optical performance of the projection system 7. As the number of contamination particles reduces, the optical transmission may improve. Further, the life time of optical components may increase.

In the embodiment shown in FIG. 3, the purge system comprises a purge inlet 13 configured to supply a purge gas flow into the vacuum chamber 8. The purge gas substantially follows a certain flow path 15, collecting contamination particles along the flow path 15. Further, the purge system comprises two pumps 16, 17 arranged at side walls of the vacuum chamber 8 on opposite sides with respect to the section being traversed by the projected beam 9. The location of the purge inlet 13 and the pumps 16, 17 is designed such that the purge gas substantially follows the purge gas flow paths 15, 18. As an example, the gas flow path 15 traverses the section of the vacuum chamber 8 that is traversed by the projected beam 9. A part of such a gas flow path 15 extends from the region traversed by the projected beam 9 towards the outside of the beam of radiation so that contamination particles are removed from the region, thus improving the optical performance of the apparatus 1. Another gas flow path 18 is situated along but outside the region traversed by the projected beam 9 and directed away from the projected beam 9, to drain contamination particles away from the projected beam 9. In FIG. 3, an example contamination particle 11 is shown following a path 14 directed to the pump 17. In contrast to the situation as shown in FIG. 1, the contamination particle is collected by the pump 17 without traversing the projected beam 9, so that an optical deterioration of the apparatus 1 is counteracted. Further, as contamination particles can be removed before they can cross the substrate exchange path 6, it may be advantageously counteracted that a contamination particle is stuck to the substrate table 4.

One or more further purge gas flow paths may be provided to remove contamination particles 11 from the vacuum chamber 8. As an example, a further purge gas flow path from a section in a region in the chamber 8 being traversed by the projected beam 9, towards the outside of the projected beam 9, or a further purge gas flow path along but outside the projected beam 9 region and directed away from the projected beam may be provided. In principle, it is also possible to design only one type of purge gas flow path, e.g. a purge gas flow path extending substantially transversely with respect to the projected beam 9. Similarly, one or more purge inlets and/or one or more pumps can be arranged for substantially determining a desired purge gas flow path.

According to an aspect of the invention, one or more purge inlets are arranged near a region that is critical for contamination particles, so that contamination particles are more easily moved away, thus counteracting the presence of so-called dead zones, i.e. regions where contamination particles can stay for a relatively long time period before being removed.

According to a further aspect of the invention, one or more pumps are located desirably near a contamination particle source. As a consequence, contamination particles can be removed from the vacuum chamber 8 relatively quickly before they can traverse the projected beam 9.

According to an aspect of the invention, a hydrogen purge gas flow may be applied, desirably in a region of the chamber that is traversed by the patterned beam of radiation. Advantageously, hydrogen gas has a relatively good transmission for EUV radiation, so that the projected beam may be minimally disturbed by the hydrogen gas. Further, a halogen purge gas flow may be applied in a region of the chamber outside the patterned beam of radiation, to improve the pumping efficiency of the pumps. According to a further aspect of the invention, the purge gas flow may be provided along a surface of an optical device, to reduce the chance that contamination particles reach such an optical device surface.

A calculation of drag forces and gravity forces, respectively, exerted on contamination particles is described hereafter. A drag force exerted on a general mass particle in gas flow, and a gravity force exerted on that mass particle, are given by respectively:

$$F_d = \left(\frac{8+\pi}{3}\right) \cdot \sqrt{\frac{2\pi \cdot M}{R_0 \cdot T}} \, r^2 \cdot P \cdot u \tag{1}$$

$$F_g = g \cdot \rho \cdot \frac{4}{3}\pi \cdot r^3 \tag{2}$$

wherein $F_d$ represents a drag force exerted in the particle [N], M denotes a molar mass of the gas [kg/mol], $R_0$ denotes a gas constant [J/mol·K], T denotes the temperature [K], r denotes the radius of the particle [m], P denotes a pressure [Pa] and u denotes a relative velocity of the particle in the vacuum chamber [m/s]. Further, $F_g$ represents a gravity force exerted on the particle [N] and $\rho$ denotes the density [kg/m$^3$] of the particle.

As an example, a steel particle having a radius of 100 nm in a hydrogen flow of 10 m/s at 10 Pa and 295K appear to have a drag force much stronger than the gravity force. As a computational example, the drag force and the gravity force according to equations (1) and (2) are:

$$F_d = \left(\frac{8+\pi}{3}\right)\sqrt{\frac{2\pi \cdot 0.002}{8.31 \cdot 295}} \, (50 \cdot 10^{-9})^2 \cdot 10 \cdot 10 = 2 \cdot 10^{-15} \text{ N}$$

$$F_g = 9.81 \cdot 7800 \cdot \frac{4}{3}\pi \cdot (50 \cdot 10^{-9})^3 = 2 \cdot 10^{-17} \text{ N}$$

Figure 4:
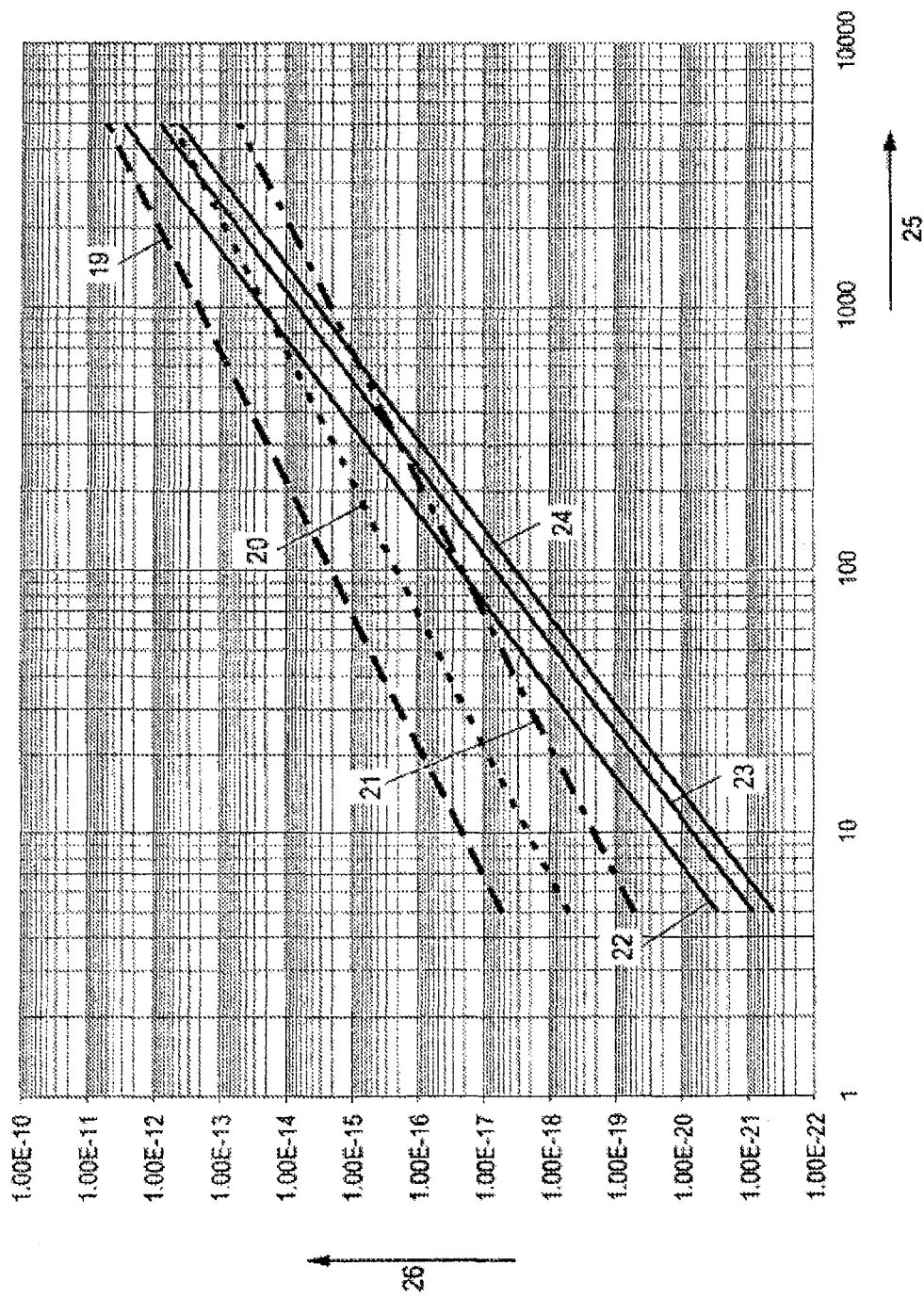
FIG. 4 depicts a chart of drag and gravity forces exerted on a particle.

FIG. 4 depicts a chart of drag and gravity forces 26 exerted on a particle as a function of the particle diameter 25 of that particle. In particular, FIG. 4 shows a drag force $F_d$ 19, 20, 21 assuming a relative velocity of the particle of 10 m/s, 1 m/s and 0.1 m/s, respectively. Similarly, FIG. 4 shows a gravity force $F_g$ 22, 23, 24 assuming a particle of steel, glass and nylon material, respectively. From the numerical results it can be deduced that the drag force exerted on relatively small particles is much greater than a gravity force exerted thereon. As a result, such relatively small particles are generally "airborne" and will easily be moved by a gas flow. On the other hand, relatively heavy and large particles are subjected to a gravity force that is greater than the drag force in a slow gas flow, so that such particles are less sensitive to the applied purge gas flow. In a practical situation, a gas flow speed can be chosen such that contamination particles that are present in the vacuum chamber can be removed by the purge gas flow.

Figure 5:
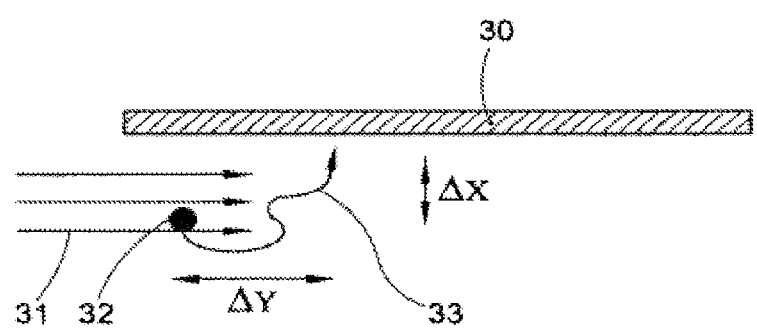
FIG. 5 depicts a schematic view of a contamination particle traveling along a surface.

Contamination particles that are moved by the purge gas flow can diffuse in a direction transverse with respect to the gas flow direction. In order to counteract a contamination particle from leaving a purge gas flow path, a time for flowing the gas along a critical surface should be smaller than a diffusion time for traversing the flow path. FIG. 5 depicts a schematic view of a contamination particle 32 travelling in a purge gas flow path 31 along a surface 30. The particle 32 can follow a diffusion path 33 that is at least partly transverse with respect to a direction ΔY along which the surface 30 extends. A diffusion path length of the contamination particle can be calculated using the following formulae:

$$\overline{\Delta X} = \sqrt{\frac{4 \cdot D \cdot t}{\pi}} \tag{3}$$

$$D = \frac{Cc \cdot k \cdot T}{3 \cdot \pi \cdot \eta \cdot Dp} \tag{4}$$

$$Cc = 1 + \frac{\lambda}{Dp} \cdot \left(2.514 + 0.8 \cdot \exp\left(-\frac{0.55 \cdot Dp}{\lambda}\right)\right) \tag{5}$$

$$\lambda = \frac{k \cdot T}{\pi \cdot \sqrt{2} \cdot \sigma^2 \cdot p} \tag{6}$$

wherein ΔX represents a diffusion path length [m] within a time t [s], D denotes a diffusion velocity [m/s], Cc denotes a Cunningham slip factor, k denotes the Boltzman constant [J/K], T denotes the temperature [K], η denotes the viscosity [Pa·s], Dp denotes the particle diameter [m], λ denotes the mean free path [m], σ denotes the gas molecule cross section and p denotes the pressure [Pa].

As an example, a contamination particle having a particle diameter of 60 nm in a gas flow of 10 m/s along a surface of 20 cm length in a direction ΔY transverse with respect to a diffusion length ΔX gives an average residence time of about 0.02 s. Within the time period of 0.02 s, the average diffusion length at 10 Pa, 295K hydrogen (σ=0.29 nm) is about 1 mm. In a practical example, therefore, by providing a purge gas flow having a velocity >10 m/s having a laminar behavior, meaning that the Reynolds number is smaller than approximately 2300, which condition is met in the transition area between molecular flow and viscous flow since the velocity is limited by the speed of sound and the flow is laminar, contamination particles in a purge gas flow path that is offset at least 1 cm from a critical surface, can in principle not reach the critical surface by diffusion. By applying an offset that is at least two times the average diffusion length, it can be counteracted that contamination particles reach a critical surface by diffusion. Further, in order to obtain a viscous flow, the Knudson parameter Kn is smaller than 1, desirably much smaller than 1. It is noted that both the average diffusion length and the free path length are dependent on the pressure. As an example, the average diffusion length is 1 mm and 3 mm at 10 Pa and 1 Pa, respectively. Similarly, the free path length is 1 mm and 10 mm at 10 Pa and 1 Pa, respectively, meaning that the purge flow can not be regarded as a viscous flow at 1 Pa.

According to a further aspect of the invention, the temperature of the purge gas flow is relatively cold. In an embodiment, the temperature of the purge gas flow is colder than the temperature of a surface of an optical device along which the purge gas flow is applied. As a result of a thermophoretic effect, contamination particles may be more easily kept away from the optical device surface.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system constructed and arranged to condition a radiation beam;
   a support constructed and arranged to support a patterning device, the patterning device being adapted to impart the radiation beam with a pattern in its cross-section to form a patterned radiation beam;
   a substrate table constructed and arranged to hold a substrate;
   a substrate handler constructed and arranged to move the substrate along a substrate exchange path;
   a projection system constructed and arranged to project the patterned radiation beam onto a target portion of the substrate;
   a vacuum chamber containing the substrate table and positioned outside the projection system such that the patterned beam of radiation is received from the projection system and projected therethrough during use, and
   a purge system constructed and arranged to provide a purge gas flow in the vacuum chamber at a purge gas flow speed of more than 10 m/s, wherein the purge system includes a purge inlet located in the vacuum chamber and outside the projection system and configured to supply the purge gas flow in the vacuum chamber, a first pump located on a first side of the chamber and configured and arranged to receive a first portion of the purge gas flow and to remove contamination particles before the contamination particles can cross the substrate exchange path, and a second pump located on a second side of the vacuum chamber opposite the first side such that a portion of the chamber through which the patterned beam of radiation is projected is disposed between the first and second pumps, the second pump being configured and arranged to receive a respective second portion of the purge gas flow.

2. The lithographic apparatus according to claim 1, wherein the purge inlet is arranged near a region that is critical for contamination particles.

3. The lithographic apparatus according to claim 1, wherein the first and second pumps are disposed at opposed side walls of the chamber.

4. The lithographic apparatus according to claim 1, wherein the pump is located near a contamination particle source.

5. The lithographic apparatus according to claim 1, wherein the purge system is constructed to provide a purge gas from a section in a region of the chamber that is traversed by the patterned beam of radiation, towards the outside of the patterned beam of radiation.

6. The lithographic apparatus according to claim 1, wherein the purge system is constructed to provide a hydrogen purge gas.

7. The lithographic apparatus according to claim 1, wherein the purge system is constructed to provide a halogen purge gas.

8. The lithographic apparatus according to claim 1, wherein the purge gas flow path is provided at a separation from a surface of the substrate of at least two times an average diffusion length of contamination particles.

9. The lithographic apparatus according to claim 1, wherein a temperature of the purge gas flow is lower than a temperature of a surface of an optical device along which the purge gas flow is applied such that thermophoretic forces push contamination particles away from the surface of the optical device.

10. The lithographic apparatus of claim 1, wherein the purge gas flow is a laminar flow.

11. The lithographic apparatus of claim 1, wherein the purge gas flow is along a surface of the substrate.

12. A device manufacturing method comprising:
   projecting a patterned beam of radiation onto a substrate;
   moving the substrate along a substrate exchange path using a substrate handler;
   providing a purge gas flow at a purge gas flow speed of more than 10 m/s via a purge inlet located in a vacuum chamber containing a substrate table for holding a substrate and which is positioned outside a projection system of a lithographic apparatus to receive the patterned beam from the projection system and through which the patterned beam of radiation is projected;

receiving the purge gas flow on opposed first and second sides of a portion of the vacuum chamber being traversed by the patterned beam of radiation using respective first and second pumps each disposed on a respective one of the first and second sides, wherein a path between a purge gas inlet and the second pump crosses the substrate exchange path; and receiving, with the first pump, a portion of the purge gas flow to remove contamination particles before the contamination particles can cross the substrate exchange path; and receiving, with the second pump, a portion of the purge gas flow before the purge gas flow can cross the patterned beam of radiation.

13. The device manufacturing method of claim 12, wherein the purge gas flow is a laminar flow.

14. The device manufacturing method of claim 12, wherein the purge gas flow is along a surface of the substrate.

\* \* \* \* \*